United States Patent
Geusic et al.

(10) Patent No.: US 6,518,615 B1
(45) Date of Patent: *Feb. 11, 2003

(54) METHOD AND STRUCTURE FOR HIGH CAPACITANCE MEMORY CELLS

(75) Inventors: Joseph E. Geusic, Berkeley Heights, NJ (US); Leonard Forbes, Corvallis, OR (US); Kie Y. Ahn, Chappaqua, NY (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 61 days.

(21) Appl. No.: 09/137,896

(22) Filed: Aug. 20, 1998

Related U.S. Application Data

(62) Division of application No. 08/087,480, filed on May 29, 1998.

(51) Int. Cl.[7] ........................ H01L 27/108; H01L 29/76; H01L 29/94; H01L 31/119
(52) U.S. Cl. ........................................ 257/301; 257/302
(58) Field of Search ................................ 257/296–313; 438/243–253

(56) References Cited

U.S. PATENT DOCUMENTS

| | | | |
|---|---|---|---|
| 4,906,590 A | 3/1990 | Kanetaki et al. | 437/52 |
| 4,977,436 A * | 12/1990 | Tsuchiya | 257/305 |
| 5,001,526 A * | 3/1991 | Gotou | 257/302 |
| 5,006,909 A * | 4/1991 | Kosa | 257/305 |
| 5,153,813 A | 10/1992 | Oehrlein et al. | 361/313 |
| 5,166,762 A * | 11/1992 | Yoshida | 257/302 |
| 5,176,789 A | 1/1993 | Yamazaki et al. | 156/643 |
| 5,191,509 A * | 3/1993 | Wen | 257/311 |
| 5,204,280 A | 4/1993 | Dhong et al. | 437/52 |
| 5,360,758 A | 11/1994 | Bronner et al. | 437/52 |
| 5,393,683 A | 2/1995 | Mathews et al. | 437/42 |
| 5,401,681 A | 3/1995 | Dennison | 437/60 |
| 5,407,534 A | 4/1995 | Thakur | 156/662 |
| 5,438,011 A | 8/1995 | Blalock et al. | 437/52 |
| 5,592,412 A | 1/1997 | Kleinhenz et al. | 365/149 |
| 5,658,816 A | 8/1997 | Rajeevakumar | 438/386 |
| 5,662,768 A | 9/1997 | Rostoker | 257/301 |
| 5,719,080 A | 2/1998 | Kenney | 438/243 |
| 5,766,968 A | 6/1998 | Armacost et al. | 437/60 |
| 6,020,609 A * | 2/2000 | Wu | 257/309 |

FOREIGN PATENT DOCUMENTS

| JP | 363066963 A * | 3/1988 | 257/305 |
|---|---|---|---|

* cited by examiner

Primary Examiner—Tom Thomas
Assistant Examiner—Cuong Quang Nguyen
(74) Attorney, Agent, or Firm—Schwegman, Lundberg, Woessner & Kluth, P.A.

(57) ABSTRACT

A method and structure for high capacitance memory cells is provided. The method includes forming a trench capacitor in a semiconductor substrate. A self-structured mask is formed on the interior surface of the trench. The interior surface of the trench is etched to form an array of silicon pillars. The self-structured mask is removed. Then an insulator layer is formed on the array of silicon pillars. A polycrystalline semiconductor plate extends outwardly from the insulator layer in the trench.

34 Claims, 5 Drawing Sheets

METHOD AND STRUCTURE FOR HIGH CAPACITANCE MEMORY CELLS

This is a divisional application of U.S. Ser. No. 08/087,480, filed May 29, 1998.

FIELD OF THE INVENTION

The present invention relates generally to semiconductor integrated circuits. More particularly, it pertains to a method and structure for high capacitance memory cells.

BACKGROUND OF THE INVENTION

Electronic systems, such as microprocessor based computers, typically operate on data that is stored in electronic form in a memory device. The memory device stores the data at specified voltage levels in an array of cells. Conventionally, the voltage levels represent that the data is either a logical "1" or a logical "0." In dynamic random access memory (DRAM) devices, for example, the cells store the data as a charge on a capacitor. When the data is read from the memory device, sense amplifiers detect the level of charge stored on a particular capacitor so as to produce a logical "1" or a logical "0" output based on the stored charge.

As the size of memory devices decreases, the capacitor in each cell covers a smaller surface area or footprint on the substrate, chip or wafer. If the structure of the capacitor is left unchanged, these smaller capacitors cannot store as much charge because the storage capacity of a typical capacitor is proportional to the size of its storage electrodes. Unfortunately, at some point, the capacitors become too small to store sufficient charge and sense amplifiers in the memory device are unable to differentiate between charge due to noise and the charge due to data stored in the cell. This can lead to errors in the output of a memory device making the memory device useless in the electronic system.

Conventionally, memory manufacturers have used one of two types of capacitors in DRAM devices. First, many manufacturers use "stacked" capacitors to store data for the memory cell. Stacked capacitors are typically formed from polysilicon and are positioned above the conventional working surface of the semiconductor chip or wafer on which the memory device is formed. A contact couples the capacitor to a transistor in the memory cell. Some manufacturers use "trench" capacitors instead of stacked capacitors. Trench capacitors are typically formed in a trench in the semiconductor wafer or chip. The trench is filled with polysilicon that acts as one plate of the capacitor. In this case, the semiconductor wafer or chip acts as the second plate of the capacitor.

Designers have experimented with various configurations of capacitors, both stacked and trench, to maintain the capacitance as the footprint available for the capacitor decreases. In the area of stacked capacitors, designers have used texturization, stacked V-shaped plates and other shaped plates to increase the surface area of the plates without increasing the footprint of the capacitor. For example, designers have developed techniques to produce hemispherical grains on the surface of one polysilicon plate of the stacked capacitor. This roughly doubles the storage capacity of the capacitor. Researchers have also described techniques for further increasing the surface area of the polysilicon plate, and thus the storage capacity of the capacitor, by using phosphoric acid to create pores in the polysilicon plate. See, Watanabe, *A Novel Stacked Capacitor with Porous-Si Electrodes for High Density DRAMs*, Symposium on VLSI Technology, pp. 17–18, 1993. These micro-roughened polysilicon surface features have sizes of the order 100 A or 10 nm. With this technique, it is claimed that a 3.4 times increase in capacitance can be achieved:

One problem with the use of stacked capacitors is their positioning above the surface of the substrate. This positioning can interfere with the proper functioning of the equipment used to fabricate other parts of a larger circuit.

Conventionally, as the footprint available for trench capacitors has decreased, the manufacturers have used deeper trenches to maintain sufficient storage capacity of the trench capacitor. IBM has developed another technique in an attempt to maintain sufficient storage capacity as the footprint of the trench capacitor decreases. This technique uses an anodic etch to create pores in the single crystalline silicon in the trench of the trench capacitor. See, U.S. Pat. No. 5,508,542 (the '542 Patent). One problem with this technique is the lack of control over the distribution of the pores in the surface of the single crystalline silicon. Thus, the '542 Patent does not provide a technique that can be used reliably for large scale production of memory devices.

For the reasons stated above, and for other reasons stated below which will become apparent to those skilled in the art upon reading and understanding the present specification, there is a need in the art for a realizable trench capacitor with increased surface area compared to prior art capacitors for use in high-density circuits such as dynamic random access memories.

SUMMARY OF THE INVENTION

The above mentioned problems with memory devices and other problems are addressed by the present invention and will be understood by reading and studying the following specification. A method and structure are provided to maximize the capacitance in memory cells.

In particular, an illustrative embodiment of the present invention includes a method for forming a trench capacitor. The method includes forming a trench with an interior surface in a semiconductor substrate. A self-structured mask is formed in the trench. The interior surface of the trench is etched to form an array of silicon pillars. The method further includes removing the self-structured mask and forming an insulator layer outwardly from the array of silicon pillars. A polycrystalline semiconductor plate is then formed outwardly from the insulator layer.

In another embodiment, a method for forming a memory cell with a trench capacitor is provided. The method includes forming a transistor with first and second source/drain regions, a body region and a gate in a layer of semiconductor material on a substrate. A trench is formed which has an interior surface in the layer of semiconductor material. A self-structured mask is formed on the interior surface in the trench. The interior surface of the trench is etched to form an array of asperities. The self-structured mask is removed and an insulator layer is formed outwardly from the array of asperities. A polycrystalline semiconductor plate is formed outwardly from the insulator layer in the trench such that the polycrystalline semiconductor plate forms one of the plates of the trench capacitor. The method further includes coupling the trench capacitor to one of the source/drain regions of the transistor.

In another embodiment, a memory cell is provided. The memory cell includes a lateral transistor formed in a layer of semiconductor material which extends outwardly from a substrate. The transistor includes a first source/drain region, a body region and a second source/drain region. A trench capacitor is formed. The trench capacitor includes a polycrystalline semiconductor plate formed in the trench which couples to the second source/drain region. A second plate is formed by the substrate. The substrate includes an array of silicon pillars formed using a self-structured mask. An insulator layer separates the polycrystalline semiconductor plate from the array of silicon pillars.

In another embodiment, a memory cell is provided. The memory cell includes a vertical transistor which is formed outwardly from a substrate. The transistor includes a first source/drain region, a body region and a second source/drain region that are vertically aligned. A surface of the second source/drain region includes an array of silicon pillars. The array is formed using a self-structured. mask. The memory cell further includes a trench capacitor with a polycrystalline semiconductor plate. The polycrystalline semiconductor plate is formed in a trench that surrounds the array of silicon pillars on the surface of the second source/drain region of the transistor.

In another embodiment, a memory device is provided. The memory device includes an array of memory cells. Each memory cell includes an access transistor which couples to a trench capacitor. A first plate of the trench capacitor has a surface which includes an array of silicon pillars. A second plate of the trench capacitor is disposed adjacent to the first plate. A number of bit lines selectively couple to a number of the memory cells at a first source/drain region of the access transistor. A number of word lines are disposed substantially orthogonal to the bit lines and couple to gates of a number of access transistors. A row decoder couples to the word lines and a column decoder couples to the bit lines so as to selectively access the cells of the array.

Thus, a higher capacitance memory cell is provided. The memory cell includes an array of silicon pillars which are formed using a self-structured mask and dry etch technique. The resulting memory cells produce from a five to ten fold increase in the capacitance levels over those presently reported for micro roughened polysilicon structures. These results are achieved without requiring additional surface space on the memory chip. Thus, the present invention is ideally suited for use in DRAMs.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other'such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1:
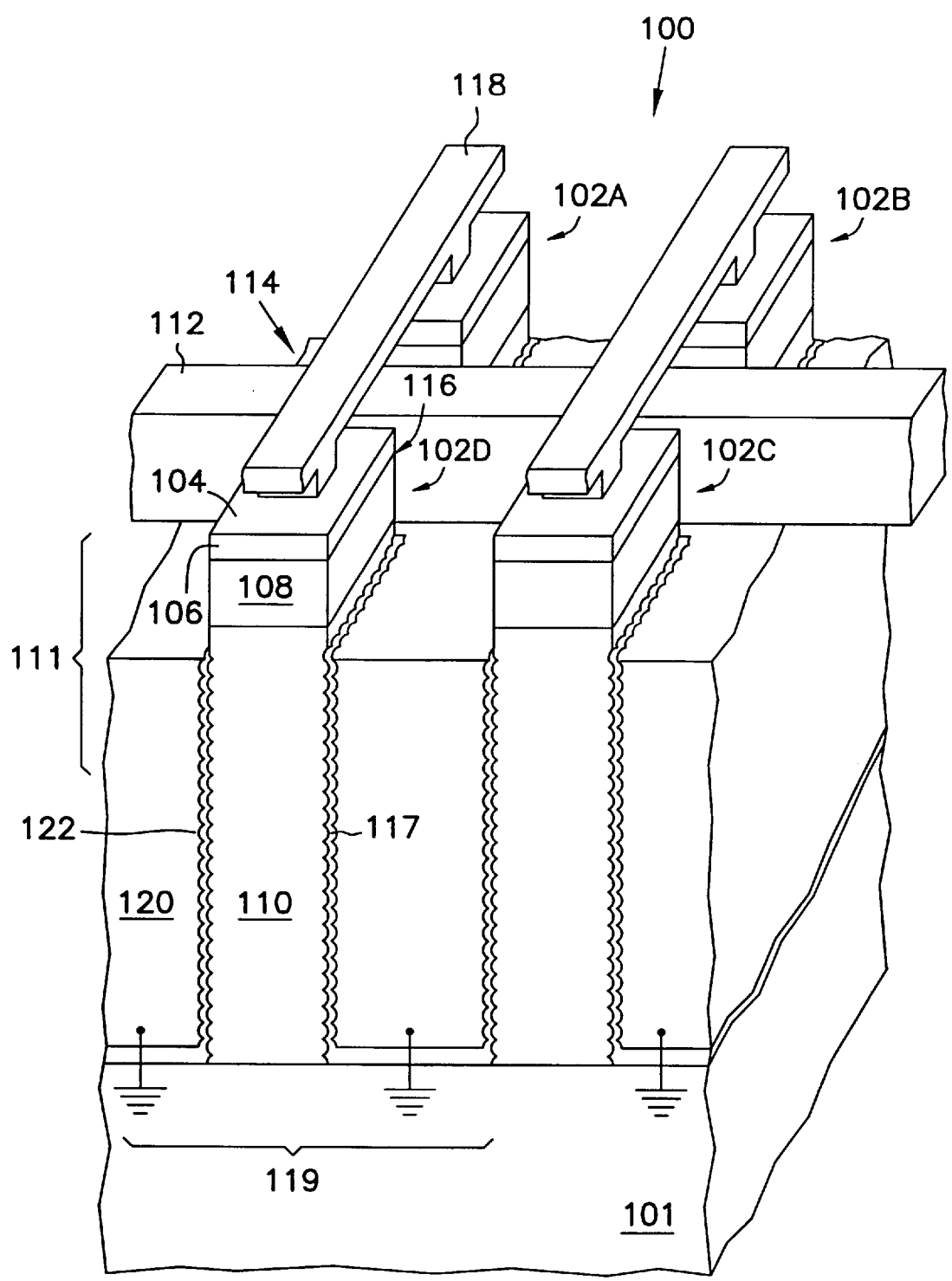
FIG. 1 is a perspective view of an embodiment of a portion of an array of memory cells according to the teachings of the present invention.

FIG. 1 is a perspective view of an embodiment of a portion of an array of memory cells indicated generally at 100 and constructed according to the teachings of the present invention. Each memory cell is constructed in a similar manner. Thus, only memory cell 102D is described herein in detail. Memory cell 102D includes pillar 104 of single crystal semiconductor material. Pillar 104 is divided into first source/drain region 106, body region 108, and second source/drain region 110 to form access transistor 111. Pillar 104 extends vertically outward from substrate 101, for example, p-silicon. First source/drain region 106 and second source/drain region 110 each comprise, for example, heavily doped n-type single crystalline silicon (N+ silicon) and body region 108 comprises lightly doped p-type single crystalline silicon (P– silicon).

Word line 112 passes body region 108 of access transistor 111 in isolation trench 114. Word line 112 is separated from body region 108 of access transistor 104 by gate oxide 116 such that the portion of word line 112 adjacent to body region 108 operates as a gate for access transistor 111. Word line 112 may comprise, for example, N+ poly-silicon material that is deposited in isolation trench 114. Cell 102D is coupled in a column with cell 102A by bit line 118.

Memory cell 102D also includes storage capacitor 119 for storing data in the cell. A first plate of capacitor 119 for memory cell 102D is integral with second source/drain region 110 of access transistor 111. Thus, memory cell 102D may be more easily realizable when compared to conventional vertical transistors since there is no need for a contact between second source/drain region 110 and capacitor 119. Surface 117 of second source/drain region 110 includes an array of asperities. The array asperities is formed using a self-structured mask and a dry etch technique upon the surface 117 of the second source/drain region 110. This increases the surface area of second source/drain region 110 and, thus, increases the capacitance of capacitor 119. The array of asperities in surface 117 can be formed, for example, using the techniques described below.

Second plate 120 of capacitor 119 is common to all of the capacitors of array 100. Second plate 120 comprises a mesh or grid of n+ poly-silicon formed in deep trenches that surrounds at least a portion of second source/drain region 110 of each memory cell 102A through 102D. Second plate 120 is grounded by contact with substrate 101 underneath the trenches. Second plate 120 is separated from source/drain region 110 by capacitor insulator 122.

Figure 2A:
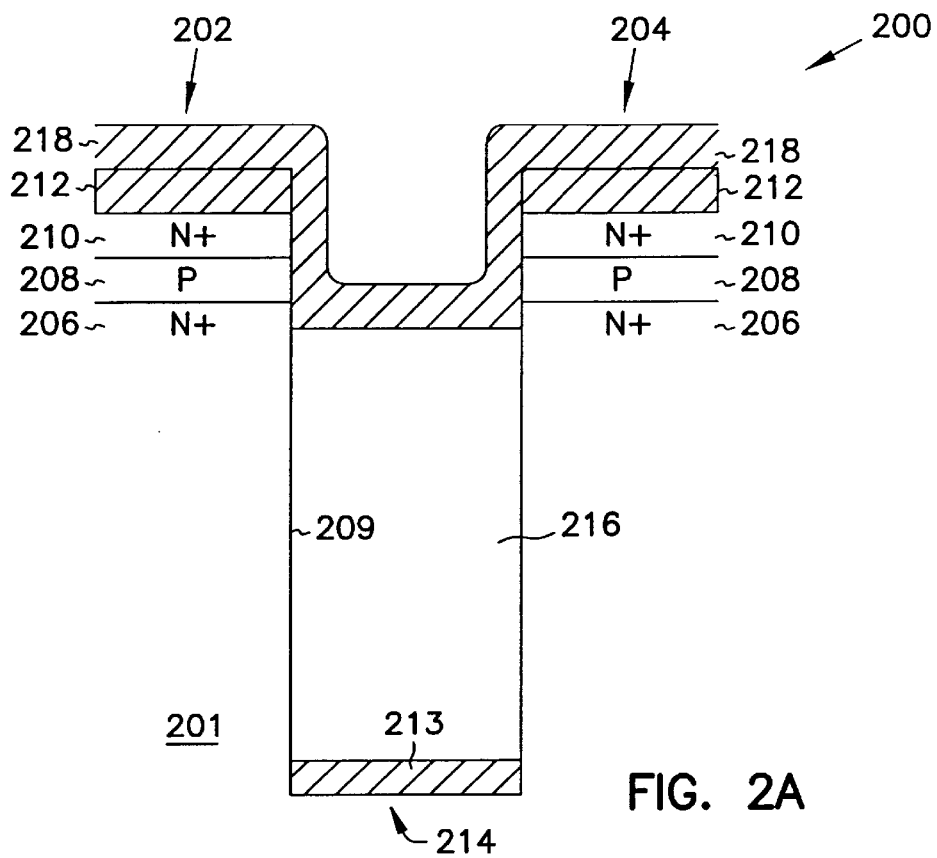
FIGS. 2A–2C are cross sectional views that illustrate an embodiment of a method for forming an array of memory cells according to the teachings of the present invention.
Figure 2B:
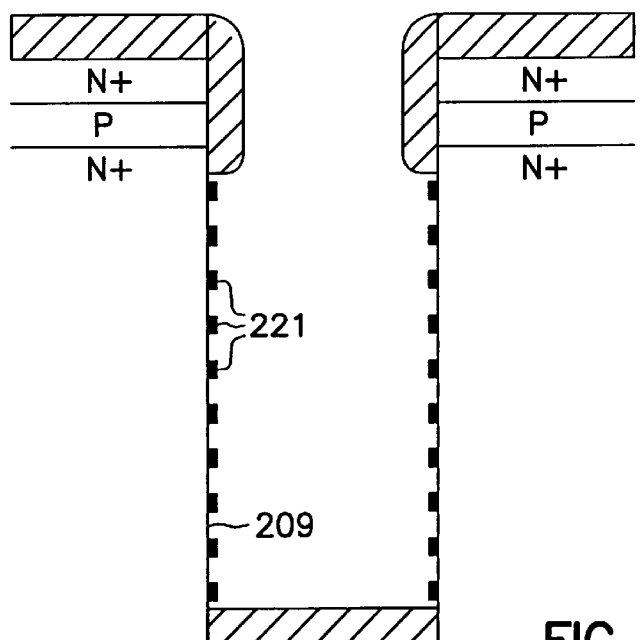
Figure 2C:
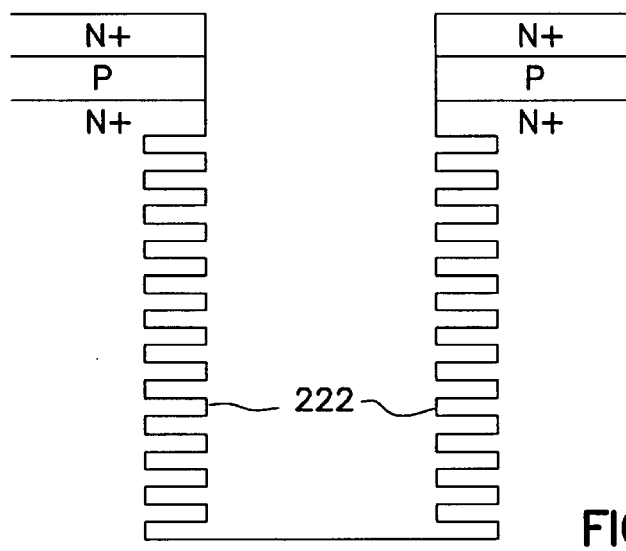

FIGS. 2A–2C are cross sectional views that illustrate an embodiment of a method for forming an array of memory cells according to the present invention. FIG. 2A is a cross sectional view that shows a portion of an array of memory cells, indicated generally at 200. Array 200 includes pillars of semiconductor material 202 and 204 that are formed either outwardly from a bulk silicon wafer or outwardly from a silicon-on-insulator (SOI) structure. Pillar 202 includes first source/drain region 210, body region 208 and second source/drain region 206. As shown, first source/drain region 210 and second source/drain region 206 comprise heavily doped n-type semiconductor material and body region 208 comprises p-type semiconductor material. Pillar 204 is similarly constructed. Pillars 202 and 204 form the basis for vertical transistors used in array 200. It is noted that the conductivity types of the various regions of the pillars can be swapped so as to allow the formation of p-channel transistors.

The silicon pillar structure of a vertical transistor of array 200 may be formed using, for example, the techniques shown and described with respect to FIGS. 5A–5J of co-pending application Ser. No. 08/944,890, entitled "Circuit and Method for an Open Bit Line Memory Cell with A Vertical Transistor and Trench Plate Trench Capacitor," filed on Oct. 6, 1997 or with respect to FIGS. 5A–5M of application Ser. No. 08/939,742, entitled "Circuit and Method for a Folded Bit Line Memory Cell with Vertical Transistors and a Trench Capacitor," filed on Oct. 6, 1997, which applications are incorporated herein by reference. Alternatively, the silicon pillars can be constructed to provide for a body contact for the transistors using techniques described with respect to FIGS. 5A–5P and 6A to 6O of co-pending, commonly assigned application Ser. No. 08/944,312, entitled "Circuit and Method for a Folded Bit Line Memory Using Trench Plate Capacitor Cells With Body Bias Contacts," filed on Oct. 6, 1997 or with respect to FIGS. 5A–5O of application Ser. No. 08/939,732, entitled "Circuit and Method for an Open Bit Line Memory Cell With A Vertical Transistor and Trench Plate Trench Capacitor," filed on Oct. 6, 1997, which applications are also incorporated herein by reference. Further, other conventional techniques for forming vertical transistors can also be used.

Once the basic silicon pillar structure is in place, interior surface 209 of second source/drain region 206 is texturized to form an array of asperities, or pillars of silicon thereupon. Initially, nitride layer 212 ($Si_3N_4$) is deposited on silicon pillars 202 and 204. Optionally, nitride pad 213 is also deposited in trench 214 to protect the bottom of trench 214 during subsequent processing steps. For example, nitride pad 213 may be used when an SOI structure is used and the bottom of trench 214 is an insulator such as an oxide.

Trench 214 is filled with an oxide such that the entire structure of array 200 is covered. The oxide material outside of trench 214 is removed by, for example, chemical/mechanical polishing down to nitride layer 212. The oxide is further recessed into trench 214 to form oxide layer 216 as shown. Nitride masking layer 218 ($Si_3N_4$) is next deposited to protect body region 208 and first source drain region 210 during the formation of an array of asperities in the interior surface 209.

As shown in FIG. 2B, nitride mask layer 218 is directionally etched to leave nitride mask layer 218 on selected surfaces of pillars 202 and 204. An alternative method of forming the nitride mask layer 218 is to employ jet vapor deposition. Using this method, the wafer is rotated and tilted from the direction of the jet by approximately 85 degrees, almost grazing incidence, so that the nitride mask layer 218 is deposited only as shown in FIG. 2B. Such a process is known by those of ordinary skill in the art of semiconductor fabrication.

Next, oxide layer 216 is removed by, for example, an etching process. The interior surface 209 is cleaned using a wet etch of hydrofluoric acid (HF). A surface treatment 221 is applied to the interior surface 209 of the trench 214. In one exemplary embodiment, the surface treatment 221 is a gold-palladium (AuPd) alloy which consist of a 6:4 combination ratio respectively. In an alternative embodiment, other suitable surface treatments 221 can be used, e.g. self-assembled-monolayer organic films. The AuPd surface treatment 221 is applied to the interior surface 209 of the trench 214 by any suitable process such as, for example, sputtering. In one exemplary embodiment, the surface treatment 221 is applied with through an ionized magnetron sputter deposition. In an alternate embodiment, the AuPd alloy 221 is sputtered onto the surface 209 using conventional techniques known by those of ordinary skill in the field of semiconductor fabrication. The AuPd alloy is sputtered on the interior surface 209 to a thickness of approximately 0.4 nanometers (nm). The sputtering process results in a surface treatment 221 of AuPd alloy islands and those have diameters of approximately less than 4 nm on approximately 20 nm centers.

FIG. 2C illustrates the structure following the next series of processing steps. Next, in one exemplary embodiment, the substrate temperature is cooled to –130 degrees Celsius. The interior surface 209 is dry etched using reactive ion etching (RIE). In one exemplary embodiment, the interior surface 209 is electron cyclotron plasma etched using a sulfur hexafluoride ($SF_6$) gas. In an alternative embodiment, other compatible etching techniques can be utilized. The etch under these conditions produces an array of asperities 222 in the surface 209 of the trench 214 as shown in FIG. 2C. The array of asperities 222 constitute pillars of silicon. In the exemplary embodiment of FIG. 2C, the pillars of silicon 222 have an average height of 100 nm, a top surface diameter of approximately $\leq 10$ nm, and a pillar density of approximately $10^{12}$ pillars per square centimeter ($10^{12}/cm^2$). In an alternative embodiment, the power density and/or $SF_6$ gas pressure can be reduced to allow for longer etch times in order to achieve other heights, diameters, and densities. Similarly, other average heights and diameters for the pillars can be achieved by varying the substrate 201 temperature and etch times.

In FIG. 2C, the surface treatment 221 is removed using any suitable, conventional stripping technique. Such stripping techniques are well know by those practiced in the art of semiconductor fabrication. The structure is now as appears in FIG. 2C. Although the above sequence of process steps has been illustrated for forming the array of memory cells in 2C, an alternative embodiment of the process provides for additional pillars of silicon 222 on the bottom surface of the trench 214. Such an alternative embodiment would be appropriate where pillars 202 and 204 extend outwardly from bulk silicon material. In this case, nitride layer 213 is not deposited at the bottom of trench 214 prior to the surface treatment 221 and etching steps.

The pillars of silicon 222 in the surface 209 of the trench increase the effective surface area of second source/drain region 206. A trench capacitor insulator can then be grown or deposited by conventional oxidation or deposition techniques. In one embodiment, a capacitor insulator is deposited using the method of atomic layer epitaxy (ALE). A polysilicon capacitor plate is also formed using conventional methods.

Figure 3:
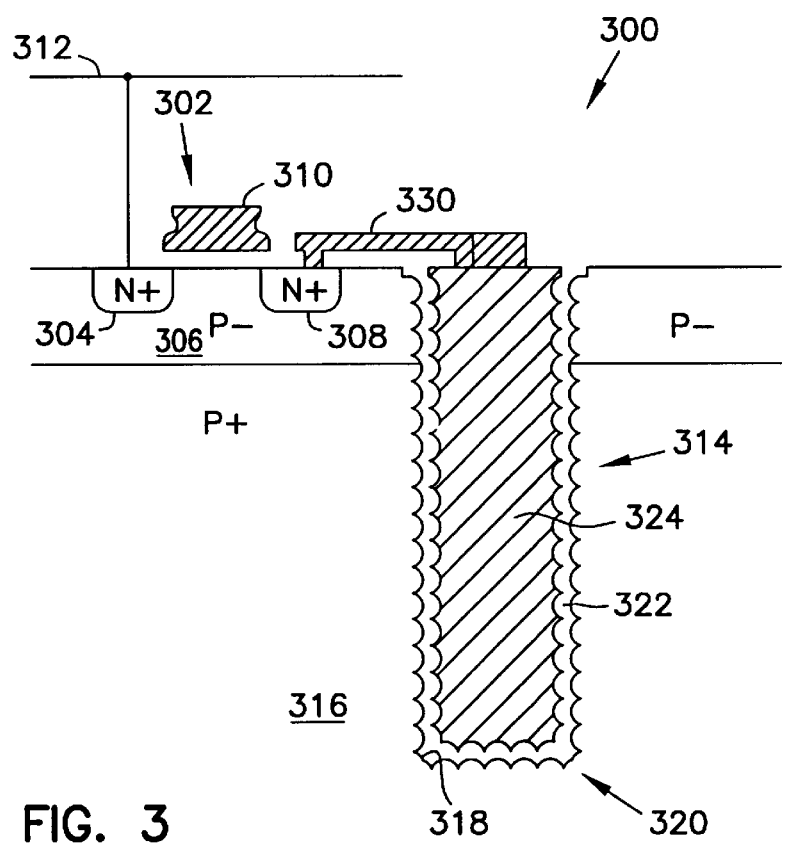
FIG. 3 is a cross sectional view of another embodiment of a memory cell according to the teachings of the present invention.

FIG. 3 is a cross sectional view of another embodiment of a memory cell according to the teachings of the present invention. Memory cell 300 includes a lateral transistor 302 with first source/drain region 304, body region 306 and second source/drain region 308. Transistor 302 also includes gate 310 that may be formed as part of a word line in a memory array as is known in the art. Bit line 312 is coupled to first source/drain region 304.

Memory cell 300 also includes trench capacitor 314. Substrate 316 forms a first plate of trench capacitor 314. Surface 318 of substrate 316 in trench 320 is formed to have an array of asperities. The array is formed using self-structured masks and a dry etch technique as described above in connection with FIGS. 2A–2C. Trench capacitor 314 also includes dielectric layer 322 that separates surface 318 from second plate 324. Second plate 324 comprises, for example, poly-silicon. Substrate 316 comprises single crystal silicon. Second plate 324 of trench capacitor 314 is coupled to second source/drain region 308 by polysilicon strap 330.

In the example of FIG. 3, transistor 302 comprises an n-channel transistor with heavily doped n-type source/drain regions and a body region formed in lightly doped p-type silicon well. Further, substrate 316 comprises a heavily doped p-type semiconductor substrate. Memory cell 300 is included in an array of similar memory cells to store and retrieve data using conventional techniques.

Figure 4A:
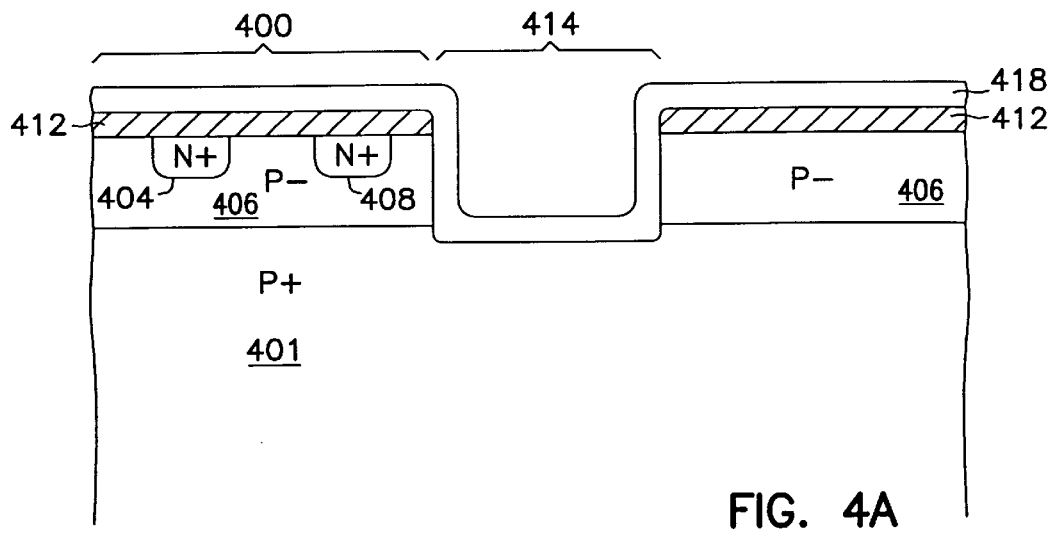
FIGS. 4A–4C are cross sectional views that illustrate another embodiment of a method for forming an array of memory cells according to the teachings of the present invention.
Figure 4B:
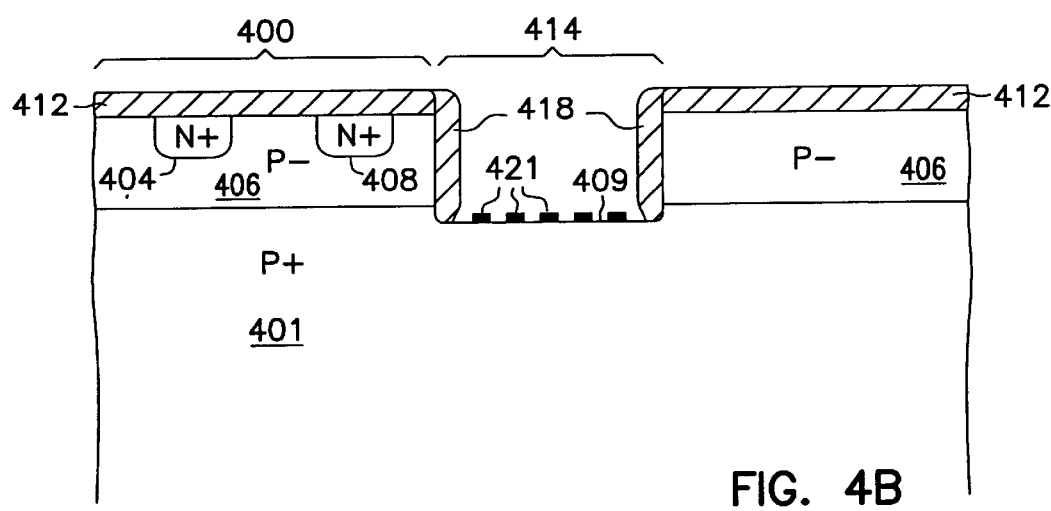
Figure 4C:
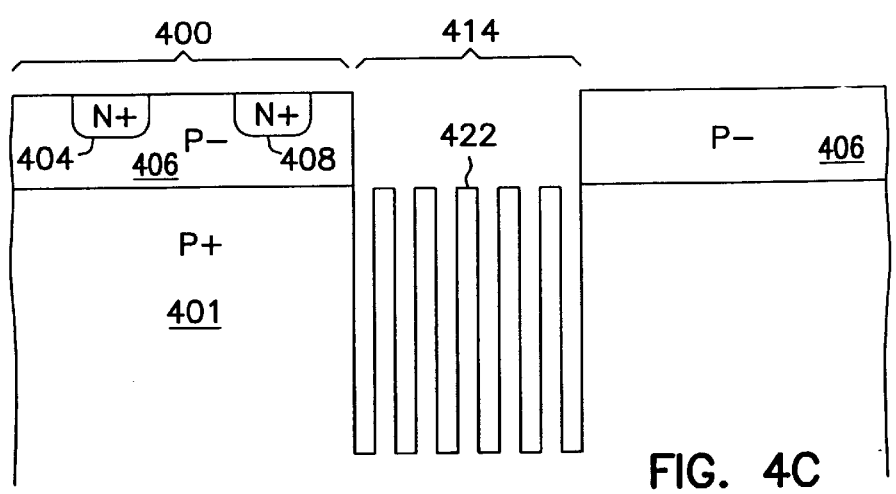

FIGS. 4A–4C are cross sectional views that illustrate another embodiment of a method for forming an array of memory cells according to the teachings of the present invention. FIG. 4A is a cross sectional view which illustrates the first series of steps, in the exemplary embodiment, of forming a trench capacitor adjacent to a lateral transistor region 400. Lateral transistor region 400 is formed outwardly from a bulk silicon wafer, e.g. the substrate 401. Region 400 includes first source/drain region 404, body region 406 and second source/drain region 408. In the exemplary embodiment, the first source/drain region 404 and second source/drain region 408 comprise heavily doped n-type semiconductor material, the body region 406 comprises lightly doped p-type semiconductor material, and the substrate 401 comprises heavily doped p-type semiconductor material. It is noted that the conductivity types of these variously stated components can be swapped so as to allow the formation of p-channel transistors.

A trench 414 is formed in the substrate 401 using conventional semiconductor fabrication techniques. Initially, a nitride layer 412 ($Si_3N_4$) is deposited on region 400. Nitride masking layer 418 ($Si_3N_4$) is next deposited over the region 400 and within the interior surface 409 of the trench 414. The nitride masking layer 418 is deposited using conventional techniques, e.g. chemical vapor deposition (CVD).

As shown in FIG. 4B, nitride mask layer 418, or nitride collar, is directionally etched to leave nitride mask layer 418 on the sidewalls of trench 414. An alternative method-of forming the nitride mask layer 418 is to employ jet vapor deposition. Using this method, the wafer is rotated and tilted from the direction of the jet by approximately 85 degrees, almost grazing incidence, so that the nitride mask layer 418 is deposited only as shown in FIG. 4B. Such a process is known by those of ordinary skill in the art of semiconductor fabrication.

Next, the interior surface 409 of the trench 414 is cleaned using a wet etch of hydrofluoric acid (HF). A surface treatment 421 is applied to the bottom of the interior surface 409 of the trench 414. In one exemplary embodiment, the surface treatment 421 is a gold-palladium (AuPd) alloy which consist of a 6:4 combination ratio respectively. In an alternative embodiment, other suitable surface treatments 421 can be used, e.g. self-assembled-monolayer organic films. The AuPd surface treatment 421 is applied to the interior surface 409 of the trench 414 by any suitable process such as, for example, by sputtering. In one exemplary embodiment, the surface treatment 421 is applied with through an ionized magnetron sputter deposition. In an alternate embodiment, the AuPd alloy 421 is sputtered onto the surface 409 using conventional techniques known by those of ordinary skill in the field of semiconductor fabrication. In the exemplary embodiment, the AuPd alloy is sputtered on the interior surface 409 to a thickness of approximately 0.4 nanometers (nm). The sputtering process results in a surface treatment 421 with diameters of less than 4 nm on approximately 20 nm centers.

FIG. 4C illustrates the structure following the next series of processing steps. Next, in one exemplary embodiment, the substrate temperature is cooled to −130 degrees Celsius and the surface 409 is dry etched using reactive ion etching (RIE). In one exemplary embodiment, the interior surface 409 is electron cyclotron plasma etched using a sulfur hexafluoride ($SF_6$) gas. In an alternative embodiment, other compatible etching techniques can be utilized. The etch under these conditions produces an array of asperities 422 in the surface 409 of the trench 414 as shown in FIG. 4C. The array of asperities 422 constitute pillars of silicon. In the exemplary embodiment of FIG. 4C, pillars of silicon 422 have an average height of 6.0 micrometers ($\mu$m), a top surface diameter of $\leq 10$ nm, and a pillar density of approximately $10^{12}$ pillars per square centimeter ($10^{12}/cm^2$). In an alternative embodiment, the power density and/or $SF_6$ gas pressure can be reduced to allow for longer etch times in order to achieve other heights, diameters, and densities. Similarly, other average heights and diameters for the microtips can be achieved by varying the substrate 401 temperature and etch times.

In FIG. 4C, the surface treatment 421 is removed using any suitable, conventional stripping technique. Such stripping techniques are well known by those practiced in the art of semiconductor fabrication. The structure is now as appears in FIG. 4C.

The pillars of silicon 422 in the bottom of the interior surface 409 of the trench 414 increase the effective surface area of the trench 414. A trench capacitor insulator can then be grown or deposited by conventional oxidation or deposition techniques. In one embodiment, a capacitor insulator is deposited using the method of atomic layer epitaxy (ALE). A polysilicon capacitor plate is also formed using conventional methods.

Figure 5:
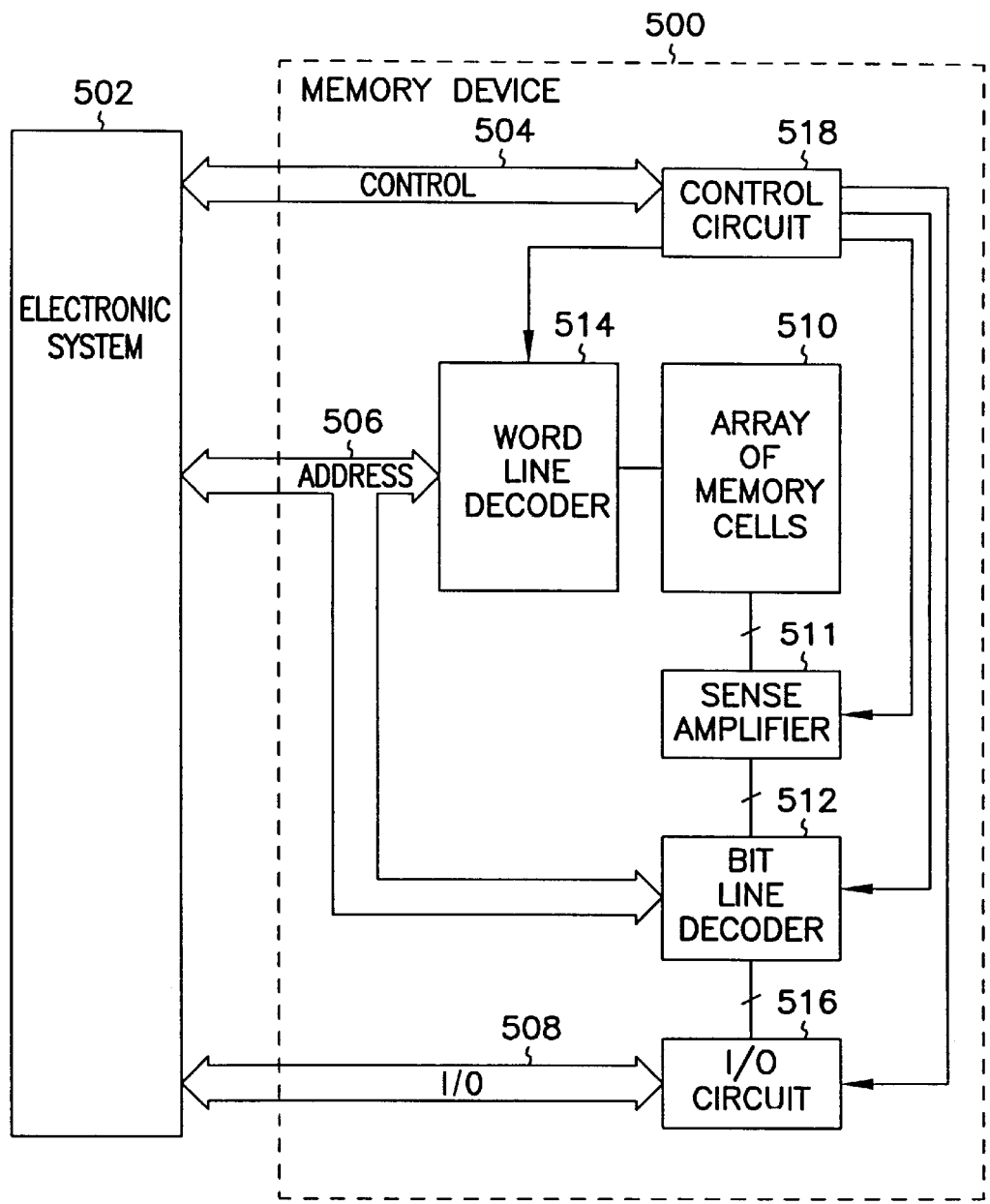
FIG. 5 is a block diagram of an embodiment of an electronic system and memory device according to the teachings of the present invention.

FIG. 5 is a block diagram of an illustrative embodiment of the present invention. This embodiment includes memory device 500 that is coupled to electronic system 502 by control lines 504, address lines 506 and input/output (I/O) lines 508. Electronic system 502 comprises, for example, a microprocessor, a processor based computer, microcontroller, memory controller, a chip set or other appropriate system for reading and writing data in a memory device. Memory device 500 includes array of memory cells 510 that is coupled to word line decoder 514 and sense amplifier 511. Array of memory cells 510 is constructed with memory cells that include trench capacitors. Each trench capacitor has a surface that includes an array of asperities that is formed using, for example, one of the techniques described above.

Word line decoder 514 includes word line drivers that are coupled to word lines of array 510. Sense amplifier 511 is coupled to bit line decoder 512. Bit line decoder 512 and word line decoder 514 are coupled to address lines 506. Bit line decoder 512 is coupled to I/O circuit 516. I/O circuit 516 is coupled to I/O lines 508. Control circuit 518 is coupled to control lines 504, sense amplifier 511, word line decoder 514, bit line decoder 512, and I/O circuit 516.

In operation, electronic system 502 provides signals on address lines 506 and control lines 504 when data is to be read from or written to a cell of array 510. Word line decoder 514 determines the word line of a selected cell of array 510 using the address provided on address lines 506. Further, bit line decoder 512 determines the bit line of the selected cell of array 510. In a read operation, sense amplifier 511 detects the value stored in the selected cell based on bit lines of array 510. Sense amplifier 511 provides this voltage to I/O circuit 516 which, in turn, passes data to electronic system 502 over I/O lines 508. In a write operation, I/O circuit 516 passes data from I/O lines 508 to sense amplifier 511 for storage in the selected cell of array 510.

Conclusion

The techniques described here are to increase the surface of DRAM capacitors by forming structured crystalline surface prior to growth or disposition of the capacitor insulator and deposition of the polysilicon plate. Thus, a higher capacitance memory cell is provided. The memory cell includes an array of silicon pillars which are formed using a self-structured mask and dry etch technique. The resulting memory cells produce from a five to ten fold increase in the capacitance levels over those presently reported for micro roughened polysilicon. These results are achieved without requiring additional surface space on the memory chip. Thus, the present invention is ideally suited for use in DRAMs.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the techniques for forming roughened surfaces can be applied to p-type vertical transistors. In this case, when an anodic etch is used, no light source is needed to create the roughened texture on the surface of the p-type semiconductor material. Semiconductor materials other than silicon can be used. Further, the conductivity type of the semiconductor material can be altered without departing from the teachings of the present invention.

What is claimed is:

1. A memory cell, comprising:
   a lateral transistor formed in a layer of semiconductor material outwardly from a substrate, the transistor including a first source/drain region, a body region and a second source/drain region;
   a trench capacitor formed in a trench and coupled to the second source/drain region; and
   wherein the trench capacitor includes a polycrystalline semiconductor plate formed in the trench that is coupled to the second source/drain region, a second plate formed by the substrate with a textured surface of the substrate including an array of silicon asperities, wherein silicon asperities within the array of silicon asperities have an average center to center spacing of 20 nanometers (nm), and an insulator layer that separates the polycrystalline semiconductor plate from the array of silicon asperities.

2. The memory cell of claim 1, wherein the polycrystalline semiconductor plate comprises polysilicon.

3. The memory cell of claim 1, wherein the second plate comprises a heavily doped p-type silicon substrate.

4. The memory cell of claim 1, wherein each silicon asperity in the array of silicon asperities has an average height of 100 nm.

5. The memory cell of claim 1, wherein each silicon asperity in the array of silicon asperities has an average diameter of 10 nm.

6. A memory cell, comprising:
   a vertical transistor formed outwardly from a substrate, the transistor including a first source/drain region, a body region and a second source/drain region that are vertically aligned;
   wherein a surface of the second source/drain region includes an array of silicon asperities, wherein silicon asperities within the array of silicon asperities have an average center to center spacing of 20 nanometers (nm); and
   a trench capacitor with a polycrystalline semiconductor plate that is formed in a trench that surrounds the array of silicon asperities on the surface of the second source/drain region of the transistor.

7. The memory cell of claim 6, wherein the second source/drain region comprises single crystalline silicon, and wherein the array of silicon asperities is formed by dry etching the surface of the second source/drain region in the presence of a sulfur hexafluoride ($SF_6$) gas.

8. The memory cell of claim 6, wherein the polycrystalline semiconductor plate comprises polysilicon.

9. The memory cell of claim 6, wherein each silicon asperities in the array of silicon asperities has an average height of 100 nm.

10. The memory cell of claim 6, wherein each silicon asperities in the array of silicon asperities has an average diameter of 10 mn.

11. A memory device, comprising:
   an array of memory cells, each memory cell including an access transistor that is coupled to a trench capacitor, wherein a first plate of the trench capacitor includes a surface having an array of silicon asperities, wherein silicon asperities within the array of silicon asperities have an average center to center spacing of 20 nanometers (nm), and a second plate of the trench capacitor is disposed adjacent to the first plate;
   a number of bit lines that are each selectively coupled to a number of the memory cells at a first source/drain region of the access transistor;
   a number of word lines disposed substantially orthogonal to the bit lines and coupled to gates of a number of access transistors; and a row decoder coupled to the word lines and a column decoder coupled to the bit lines so as to selectively access the cells of the array.

12. The memory device of claim 11, wherein the first plate comprises a single crystalline silicon source/drain region, wherein the array of silicon asperities is formed using a self-structured mask and by dry etching the surface in the presence of a sulfur hexafluoride ($SF_6$) gas.

13. The memory cell of claim 11, wherein the second plate comprises polysilicon.

14. The memory device of claim 11, wherein each silicon asperities in the array of silicon asperities has an average height of 100 nm.

15. The memory device of claim 11, wherein each silicon asperities in the array of silicon asperities has an average diameter of 10 nm.

16. The memory device of claim 13, wherein the access transistor comprises a lateral transistor that is coupled to the second plate of the trench capacitor, wherein the first plate comprises a single crystalline silicon substrate, wherein the array of silicon asperities is formed on a surface of the substrate using a self-structured mask and by dry etching the surface in the presence of a sulfur hexafluoride ($SF_6$) gas.

17. A memory device, comprising:
an array of memory cells, each memory cell including an access transistor that is coupled to a trench capacitor, wherein a first plate of the trench capacitor includes a textured surface having a plurality of asperities formed thereon, wherein the asperities within the plurality of asperities have an average center to center spacing of 20 nanometers (nm), wherein a second plate of the trench capacitor is disposed adjacent to the first plate, wherein the second plate of the trench capacitor also includes a textured surface having an array of asperities;
a number of bit lines that are each selectively coupled to a number of the memory cells at a first source/drain region of the access transistor;
a number of word lines disposed substantially orthogonal to the bit lines and coupled to gates of a number of access transistors; and
a row decoder coupled to the word lines and a column decoder coupled to the bit lines so as to selectively access the cells of the array comprises a lateral transistor.

18. The memory device of claim 17, wherein each asperity on the first plate and on the second plate has an average height of 100 nm.

19. The memory device of claim 17, wherein each asperity on the first plate and the second plate has an average diameter of 10 nm.

20. The memory device of claim 17, wherein the access transistor in each memory cell comprises a lateral transistor.

21. A memory cell, comprising:
a transistor formed in a layer of semiconductor material outwardly from a substrate, the transistor including a first source/drain region, a body region and a second source/drain region;
a trench capacitor formed in a trench and coupled to the second source/drain region; and
wherein the trench capacitor includes a polycrystalline semiconductor plate formed in the trench that is coupled to the second source/drain region, a second plate formed by side surfaces of the trench capacitor, the side surfaces extending outwardly from a bottom surface of the trench capacitor, the side surfaces including a textured surface having an array of silicon asperities, and an insulator layer that separates the polycrystalline semiconductor plate from the array of silicon asperities, wherein the silicon asperities within the array of silicon asperities have an average center to center spacing of 20 nanometers (nm).

22. The memory cell of claim 21, wherein the bottom surface is free of asperities.

23. The memory cell of claim 21, wherein the bottom surface is formed by a substrate.

24. The memory cell of claim 21, wherein the side surfaces are formed by a substrate.

25. The memory cell of claim 21, wherein the array of silicon asperities are uniform on the side surfaces.

26. A memory cell, comprising:
a transistor formed in a layer of semiconductor material outwardly from a substrate, the transistor including a first source/drain region, a body region and a second source/drain region;
a trench capacitor formed in a trench and coupled to the second source/drain region; and
wherein the trench capacitor includes a polycrystalline semiconductor plate formed in the trench that is coupled to the second source/drain region, a second plate formed by side surfaces of the trench capacitor, the side surfaces extending outwardly from a bottom surface of the trench capacitor, the side surfaces including a textured surface having an array of silicon asperities, and an insulator layer that separates the polycrystalline semiconductor plate from the array of silicon asperities, wherein the array of silicon asperities has a density of approximately $10^{12}$ pillars per square centimeter.

27. A memory cell, comprising:
a transistor formed in a layer of semiconductor material outwardly from a substrate, the transistor including a first source/drain region, a body region and a second source/drain region;
a trench capacitor formed in a trench and coupled to the second source/drain region; and
wherein the trench capacitor includes a polycrystalline semiconductor plate formed in the trench that is coupled to the second source/drain region, a second plate formed by side surfaces of the trench capacitor, the side surfaces extending outwardly from a bottom surface of the trench capacitor, the side surfaces including a textured surface having an array of silicon asperities, and an insulator layer that separates the polycrystalline semiconductor plate from the array of silicon asperities, wherein the array of silicon asperities are spaced approximately 18 nm from adjacent silicon asperities.

28. A trench capacitor, comprising:
a polycrystalline semiconductor plate in a trench;
a second plate formed by side surfaces of the trench, the side surfaces extending outwardly from a bottom surface of the trench capacitor, the side surfaces including a textured surface having an array of silicon asperities; and
an insulator layer that separates the polycrystalline semiconductor plate from the array of silicon asperities, wherein silicon asperities within the array of silicon asperities have an average center to center spacing of 20 nanometers (nm).

29. The capacitor of claim 28, wherein the bottom surface is free of asperities.

30. The capacitor of claim 28, wherein the bottom surface is formed by a substrate.

31. The capacitor of claim 28, wherein the side surfaces are formed by a substrate.

32. The capacitor of claim 28, wherein the array of silicon asperities has a density of approximately $10^{12}$ pillars per square centimeter.

33. The capacitor of claim 28, wherein the array of silicon asperities are uniform on the side surfaces.

34. The capacitor of claim 28, wherein the array of silicon asperities are spaced approximately 18 nm from adjacent silicon asperities.

* * * * *

UNITED STATES PATENT AND TRADEMARK OFFICE
CERTIFICATE OF CORRECTION

PATENT NO.    : 6,518,615 B1
DATED         : February 11, 2003
INVENTOR(S)   : Leonard Forbes, Kie Y. Ahn and Joseph E. Geusic It is certified that error appears in the above-identified patent and that said Letters Patent is hereby corrected as shown below:

Column 10,
Line 52, delete "10 mn" and insert -- 10 nm -- therefor.

Column 11,
Line 9, delete "cell" and insert -- device -- therefor.
Lines 45-46, delete "comprises a lateral transistor" after "array".

Signed and Sealed this

Second Day of September, 2003

JAMES E. ROGAN
*Director of the United States Patent and Trademark Office*